(12) United States Patent
Kuroda et al.

(10) Patent No.: US 9,069,128 B2
(45) Date of Patent: Jun. 30, 2015

(54) OPTO-ELECTRIC COMBINED CIRCUIT BOARD AND ELECTRONIC DEVICES

(75) Inventors: Toshihiro Kuroda, Ibaraki (JP);
Tomoaki Shibata, Ibaraki (JP);
Shigeyuki Yagi, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 745 days.

(21) Appl. No.: 13/130,383

(22) PCT Filed: Nov. 21, 2008

(86) PCT No.: PCT/JP2008/071202
§ 371 (c)(1),
(2), (4) Date: Jul. 25, 2011

(87) PCT Pub. No.: WO2010/058476
PCT Pub. Date: May 27, 2010

(65) Prior Publication Data
US 2011/0274389 A1 Nov. 10, 2011

(51) Int. Cl.
G02B 6/00 (2006.01)
G02B 6/122 (2006.01)
H05K 1/02 (2006.01)
G02B 6/43 (2006.01)
H05K 1/03 (2006.01)

(52) U.S. Cl.
CPC ............... *G02B 6/1221* (2013.01); *G02B 6/43* (2013.01); *H05K 1/0274* (2013.01); *H05K 1/028* (2013.01); *H05K 1/0393* (2013.01)

(58) Field of Classification Search
None
See application file for complete search history.

(56) References Cited

U.S. PATENT DOCUMENTS

| 7,738,755 B2 * | 6/2010 | Shioda .......................... 385/130 |
| 2009/0041408 A1 | 2/2009 | Kondo et al. |
| 2009/0142026 A1 | 6/2009 | Shioda |
| 2009/0317048 A1 | 12/2009 | Shioda et al. |
| 2010/0119191 A1 | 5/2010 | Shibata et al. |

FOREIGN PATENT DOCUMENTS

| EP | 2239604 | 10/2010 |
| JP | 2007-305936 | 11/2007 |
| JP | 2008-122908 | 5/2008 |
| JP | 2008-262244 | 10/2008 |

OTHER PUBLICATIONS

Japanese Official Action dated Feb. 5, 2013, for JP Application No. 2009-525813.
Taiwanese Official Action dated Oct. 23, 2013, for TW Application No. 097145541.
Korean Official Action dated Sep. 19, 2014, for KR Application No. 10-2011-7011646.

* cited by examiner

*Primary Examiner* — Tina Wong
(74) *Attorney, Agent, or Firm* — Fitch Even Tabin & Flannery

(57) ABSTRACT

The present invention relates to a flexible opto-electric combined circuit board in which an optical waveguide film provided with a core and a clad is bonded to a flexible electric wiring board, wherein a reinforcing material is provided to at least a part of an optical waveguide film side in a bent part and electronic devices prepared by using the above flexible opto-electric combined circuit board.
Capable of being provided are an opto-electric combined circuit board in which an optical waveguide film is bonded to a flexible electric wiring board and in which braking and cracking are not generated by bending or folding back and electronic devices prepared by using the above opto-electric combined circuit board.

6 Claims, 3 Drawing Sheets

OPTO-ELECTRIC COMBINED CIRCUIT BOARD AND ELECTRONIC DEVICES

BACKGROUND OF THE INVENTION

The present invention relates to an opto-electric combined circuit board in which optical wirings having a flexibility are combined with electrical wirings and an electronic device prepared by using the above board.

RELATED ART

In recent years, in high speed & high density signal transmission between electronic devices and between wiring boards, transmission through conventional electric wirings is restricted in a rise in a speed and a density due to barriers brought about by mutual interference and attenuation of signals. In order to break through the above barriers, a technique for connecting electronic devices and wiring boards with each other by means of light, so-called optical interconnection is investigated. A polymer optical waveguide attracts attentions as an optical transmission line in terms of easier processing, a lower cost, a higher freedom of wirings and a possible rise in a density.

In particular, it is investigated to use an optical waveguide for Cellular phones, Notebook computers and the like, and in order to meet space saving and a reduction in a thickness, attentions are paid to an opto-electric combined circuit board in which optical wirings are combined with electrical wirings (refer to a patent document 1 and FIG. 2).

On the other hand, it is assumed that in electronic devices such as a Cellular phone which is one of uses of an opto-electric combined circuit board, a flexible opto-electric combined circuit board is used for signal transmission between two openable and closable mechanical sections, and it is considered that the above flexible opto-electric combined circuit board straddles across a connecting part (hinge) of two mechanical sections. Usually, the above flexible opto-electric combined circuit board is bent so that a flexible electric wiring board side is brought into contact with a hinge, and breaking and cracking are caused in a certain case on an optical waveguide part by bending. In particular, the board is required to be bent in a hinge at a small bending radius in which R is 1.5 to 2 mm because of request to a reduction in a size of electronic devices in recent years, and therefore the problem that breaking and cracking are notably brought about has been involved therein.

In order to solve the problem described above, proposed is a flexible electric wiring board characterized by that an optical waveguide film is partially bonded to a flexible electric wiring board and that at least a part in which a board face is bent is not bonded thereto (refer to claims of a patent document 2).

Patent document 1: Japanese Patent No. 3193500
Patent document 2: Japanese Patent Application Laid-Open No. 284925/2006

DISCLOSURE OF THE INVENTION

However, the present inventors have found that a structure in which an optical waveguide film is partially separated from a flexible electric wiring board involves the problem that when bending is actually carried out by a hinge, particularly when the electronic device has a slide structure and further has a structure in which a bending part moves following sliding in the state that an opto-electric combined circuit board is bent at the bending part as a center, an optical waveguide is liable to deviate to a lateral direction against the flexible electric wiring board and an adhesion surface thereof and that the above lateral deviation allows the optical waveguide to move while deforming when it slides, so that it is liable to be broken. In particular, when the opto-electric combined circuit board is long, the above tendency is notable. A side guide mechanism can be provided in order to prevent the above deviation of the optical waveguide to the lateral direction, but it is very troublesome and highly disadvantageous in electronic devices which are required to be reduced in a size.

That is, in an opto-electric combined circuit board having a separated structure shown in the patent document 2, the problem that ultimately, a stress is exerted on an optical waveguide part to result in causing braking and cracking has not yet come to be solved.

Accordingly, the present invention has been made in order to solve the problems described above, and an object thereof is to provide an opto-electric combined circuit board in which an optical waveguide film is bonded to a flexible electric wiring board and in which breaking and cracking are not brought about by bending and folding and electronic devices prepared by using the above opto-electric combined circuit board.

The present inventors have paid attentions on that in an opto-electric combined circuit board, a part on which a stress is exerted when the mixed load board is bent at a hinge is influenced to a large extent by an electric wiring of a copper wire constituting an electric wiring board and that the stress is concentrated on a core part of an optical waveguide. That is, it is estimated that since a metal material used for an electric wiring has a very high elastic modulus as compared with those of other materials, a stress center is deviated to an electric wiring part, whereby a stress is concentrated on a core part of an optical waveguide to make the optical waveguide liable to be broken. Thus, intensive investigations repeated by the present inventors have resulted in finding that the problems described above can be solved by arranging a core part of an optical waveguide and an electric wiring of a flexible electric wiring board in a bending part so that they are not overlapped in a projection plane. The present invention has been completed based on the above knowledge.

That is, provided are an opto-electric combined circuit board in which an optical waveguide film provided with a core and a clad is bonded to a flexible electric wiring board, wherein a core part of an optical waveguide and an electric wiring of a flexible electric wiring board in a bending part are not overlapped in a projection plane and electronic devices comprising the above opto-electric combined circuit board.

The opto-electric combined circuit board of the present invention and the electronic devices prepared by using the above opto-electric combined circuit board have such a very good flexural durability that breaking and cracking are not generated even after repeating bending over a long period of time and can maintain a good communication function.

Figure 1:
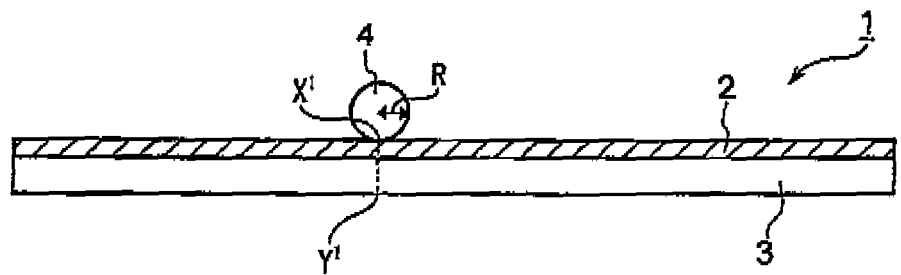
FIG. 1 is a conceptual drawing showing an opto-electric combined circuit board.

EXPLANATION of CODES 1. opto-electric combined circuit board
2. Optical waveguide film
3. Flexible electric wiring board
4. Hinge
6. Bending part
7. bending axis
21. Core part
31. Electric wiring

BEST MODE FOR CARRYING OUT THE INVENTION

The opto-electric combined circuit board of the present invention is characterized by that an optical waveguide film provided with a core and a clad is bonded to a flexible electric wiring board and that a core part of an optical waveguide and an electric wiring of a flexible electric wiring board in a bending part are not overlapped in a projection plane. In the present invention, the core part and the electric wiring in the bending part are preferably not overlapped in a projection plane, and they may be or may not be overlapped in a part other than the bending part, for example, an end part. However, an electric contact point at an end part has to have a connection tolerance in terms of a reduction in a size of electronic devices prepared by using the opto-electric combined circuit board of the present invention by making the electric contact point broader by several times than a wiring path, and since a core for optical communication is located in a layer different from that of an electric wiring, the core part and the electric wiring are preferably overlapped at least in one end part, preferably in both end parts (at least a part other than the bending part).

The present invention shall be explained below in details with reference to the drawings.

In the opto-electric combined circuit board 1 of the present invention, an optical waveguide film 2 provided with a core and a clad is bonded, as shown in FIG. 1, to a flexible electric wiring board 3, and considering an adhesive property between the optical waveguide film 2 and the flexible electric wiring board 3, they are bonded preferably over a whole surface. In the above case, bonding shows adhesion or close contact and means that they have an adhesive property or a close contact property to such an extent that they are not peeled off when bending the opto-electric combined circuit board.

Figure 2:
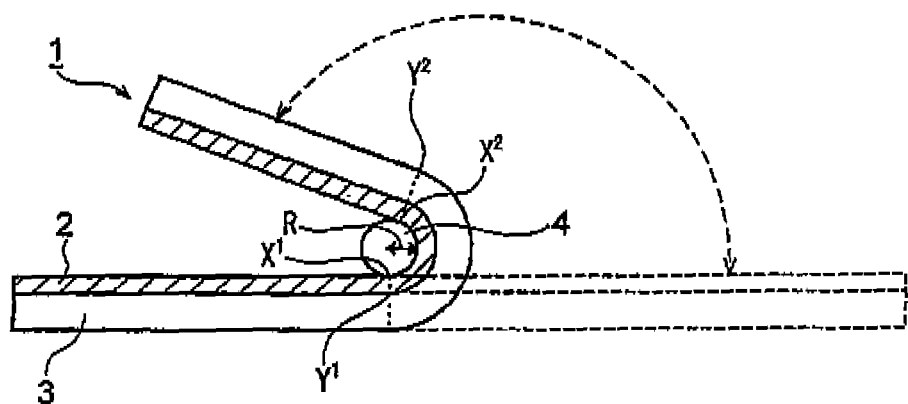
FIG. 2 is a conceptual drawing showing a state in which an opto-electric combined circuit board is bent.
Figure 3:
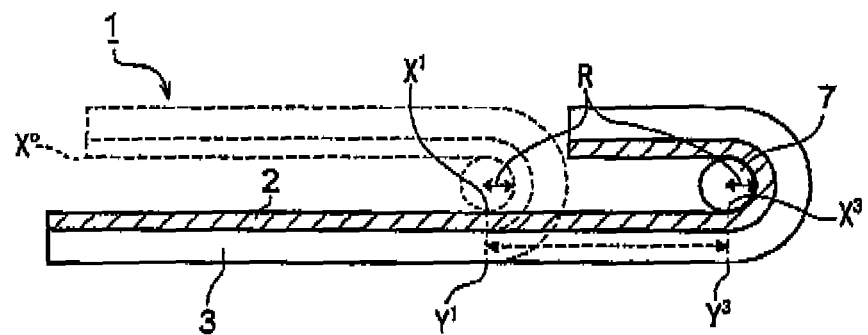
FIG. 3 is a conceptual drawing showing one example of an opto-electric combined circuit board in a case where an electronic device has a slide structure.

The opto-electric combined circuit board of the present invention is applied to an electronic device having a structure in which a part of the opto-electric combined circuit board is movable, as shown in FIG. 2, to a rotational direction at a hinge 4 as a center or an electronic device having a slide structure as shown in FIG. 3.

Figure 4:
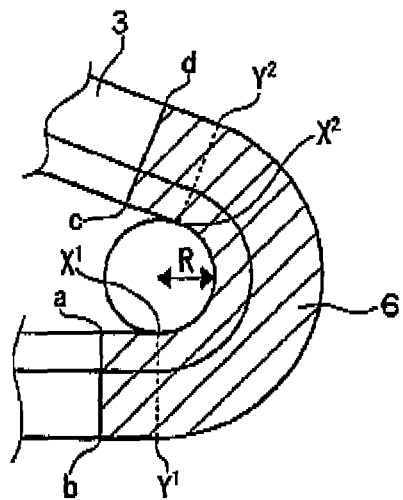
FIG. 4 is an enlarged drawing of a hinge part in FIG. 2.

In this regard, the bending part in the present invention shows a bending part or a bent part in a general term, that is, a part starting from a bending initiation point to a bending termination point. For example, when the opto-electric combined circuit board is bent by using a hinge, the bending part in the present invention shows a part brought into contact with the hinge in a state in which the opto-electric combined circuit board is bent and an outer edge part thereof. To be more specific, it shows a part, as shown in FIG. 4 which is an enlarged drawing of the hinge, surrounded by a bending initiation point $X^1$ brought into contact with the hinge in which bending is initiated, a bending termination point $X^2$ in which bending is terminated and an optical waveguide film side part $Y^1$, $Y^2$ which correspond to $X^1$ and $X^2$ and a part 6 which is extended from the above part to an outside and surrounded by a, b, c and d. In this connection, a distance between a and $X^1$ in the extended part shall not specifically be restricted as long as the effects of the present invention can be created, and it is 1 to 10% of the distance between $X^1$ and $X^2$.

In an electronic device having a slide structure shown in FIG. 3, when an opto-electric combined circuit board in which a hinge is not used is bent at a bending center as is the case with the opto-electric combined circuit board provided with the hinge described above, a bending part shows, assuming an axis 7 (hereinafter referred as a bending axis) corresponding to the hinge 4 in a state in which the opto-electric combined circuit board is bent, a part brought into contact with the above bending axis and an outer edge part thereof, and it is defined by replacing the hinge 4 with the bending axis 7 in the explanation of the bending part described above. The above bending axis may be actually present to achieve a slide structure by allowing the above bending axis to move to a horizontal direction while rotating or without rotating, or the bending axis 7 may not be present to achieve a slide structure by interposing the opto-electric combined circuit board 1 from upper and lower sides by means of caps and allowing an end part $X^0$ of the opto-electric combined circuit board 1 to move to a horizontal direction by moving of the above caps. An end part of the opto-electric combined circuit board at an opposite side is usually fixed, and it may assume a structure in which it moves to a direction reverse to that of the end part $X^0$.

The present invention is suitably applied particularly to an electronic device having a slide structure shown in FIG. 3. That is, the opto-electric combined circuit board 1 assumes a structure in which the straight line parts of the flexible opto-electric combined circuit board located at upper and lower sides are arranged almost parallel to each other in a state in which the opto-electric combined circuit board is bent in a bending part as a center. It assumes a structure in which at least one end part $X^0$ of the opto-electric combined circuit board 1 moves to a horizontal direction (a right direction in FIG. 3) while maintaining the above bent state and in which the bending part moves following the above movement. That is, the bending initiation point moves along with the movement of the end part $X^0$. Also in the above case, the effects of the present invention are exerted by controlling a core part of the optical waveguide and an electric wiring of the flexible electric wiring board so that they are not overlapped in a projection plane in the bending part.

The opto-electric combined circuit board 1 of the present invention is characterized by that the core part of the optical waveguide and the electric wiring of the flexible electric wiring board are not overlapped, as described above, in a projection plane in the bending part.

Figure 5:
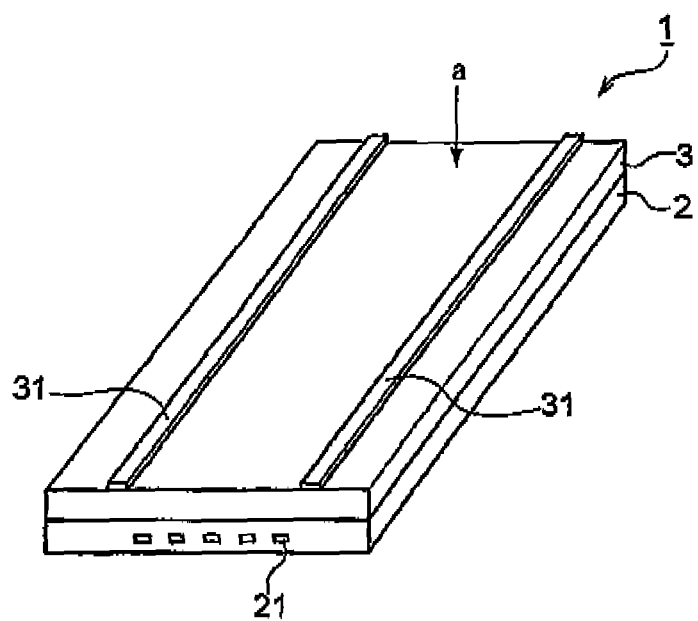
FIG. 5 is a perspective drawing showing one example of the opto-electric combined circuit board of the present invention.
Figure 6:
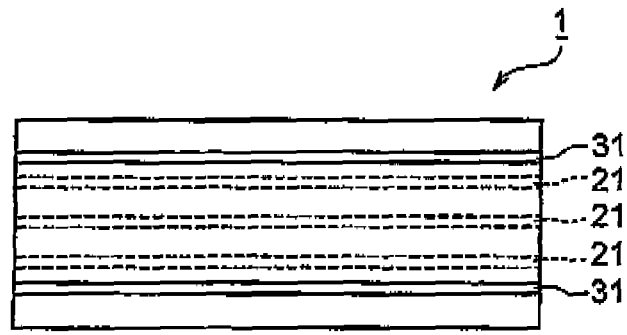
FIG. 6 is a projected drawing obtained by observing the opto-electric combined circuit board of the present invention shown in FIG. 5 from a direction.

FIG. 5 and FIG. 6 show one of the embodiments of the opto-electric combined circuit board of the present invention. FIG. 5 is a perspective drawing, and FIG. 6 is a projected drawing obtained by observing the opto-electric combined circuit board shown in FIG. 5 from an a direction. In the embodiment shown in FIG. 5 and FIG. 6, electric wirings 31 are arranged at both outsides of the flexible electric wiring board 1; core parts 21 are arranged at a central part; and they are arranged so that they are not overlapped with each other in a projection plane.

Figure 7:
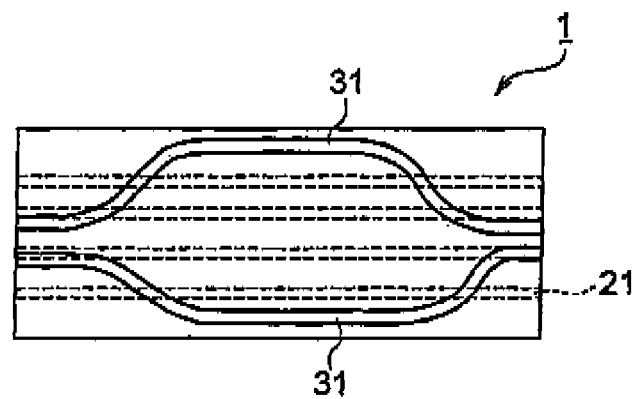
FIG. 7 is a projected drawing showing another example of the opto-electric combined circuit board of the present invention.
Figure 8:
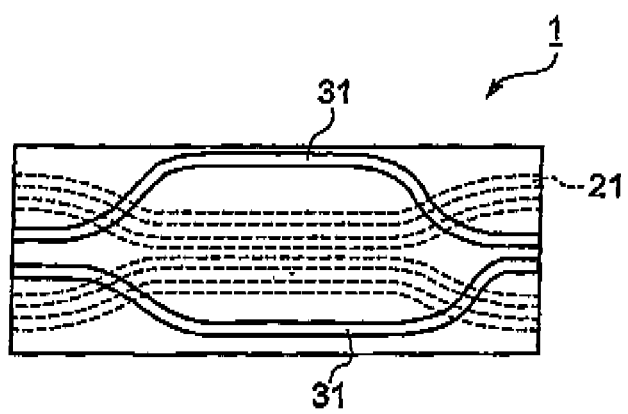
FIG. 8 is a projected drawing showing another example of the opto-electric combined circuit board of the present invention.

Next, FIG. 7 is a projected drawing showing another example of the opto-electric combined circuit board of the present invention. Electric wirings 31 draw curves to both outside directions, and a core part 21 is linear between both ends. Assumed is an embodiment in which the electric wiring 31 and the core part 21 are not overlapped in a bending part and in which both are partially overlapped in an end part.

The optical waveguide film and the flexible electric wiring board which are used in the present invention shall be explained below.

[Optical Waveguide Film]

The optical waveguide film of the present invention is provided with a core and a clad, and products which have so far been used as an optical waveguide film can be used. For example, a resin film for forming an optical waveguide comprising a resin composition containing (A) a base polymer, (B) a photopolymerizable compound and (C) a photopolymerization initiator can be used.

When a cured matter such as a film and the like is formed, the base polymer (A) is used in order to secure a strength thereof and shall not specifically be restricted as long as the above purpose can be achieved, and it includes phenoxy resins, epoxy resins, (meth)acryl resins, polycarbonate resins, polyallylate resins, polyetheramides, polyetherimides, polyethersulfones and the like and derivatives thereof. The above base polymers can be used alone or in a mixture of two or more kinds thereof.

The photopolymerizable compound (B) shall not specifically be restricted as long as it is polymerized by irradiation with light such as a UV ray and the like, and it is preferably a compound having an ethylenically unsaturated group in a molecule from the viewpoint of a reactivity to light. To be specific, it includes (meth)acrylates, vinylidene halides, vinyl ethers, vinylpyridine, vinylphenol and the like, and among them, (meth)acrylates are preferred from the viewpoint of the transparency and the heat resistance. Any of the monofunctional compounds, the difunctional compounds and the trifunctional compounds can be used as the (meth)acrylate.

In this regard, (meth)acrylate means acrylate and methacrylate.

The photopolymerization initiator (C) shall not specifically be restricted and includes, for example, aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butane-1-one, 2,2-dimethoxy-1,2-diphenylethane-1-one, 1-hydroxycyclohexyl phenyl ketone, 2-hydroxy-2-methyl-1-phenylpropane-1-one, 1-[4-(2-hydroxyethoxy)phenyl]-2-hydroxy-2-methyl-1-propane-1-one, 1,2-dimethyl-1-[4-(methylthio)phenyl]-2-morpholino-propane-1-one and the like; quinone derivatives such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, 2,3-dimethylanthraquinone and the like; benzoin ether compounds such as benzoin methyl ether, benzoin ethyl ether, benzoin phenyl ether and the like; benzoin compounds such as benzoin, methylbenzoin, ethylbenzoin and the like; benzyl derivatives such as benzyl dimethyl ketal and the like; 2,4,5-triarylimidazole dimers such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer and the like; phosphine oxides such as bis(2,4,6-trimethylbenzoyl)phenylphosphine oxide, bis(2,6-dimethoxybenzoyl)-2,4,4-trimethylpentylphosphine oxide, 2,4,6-trimethylbenzoyldiphenylphosphine oxide and the like; acridine derivatives such as 9-phenylacridine, 1,7-bis(9,9'-acridinyl)heptane and the like; N-phenylglycine, N-phenylglycine derivatives, coumarin base compounds and the like.

A blend amount of the base polymer (A) is preferably 10 to 80% by mass based on the whole amount of the component (A) and the component (B). If the above blend amount is 10% by mass or more, a thick film having a thickness of 50 µm or more can readily be produced when a film is formed. On the other hand, if it is 80% by mass or less, the optical curing reaction sufficiently goes on. From the viewpoints described above, a blend amount of the base polymer (A) is more preferably 20 to 70% by mass.

A blend amount of the photopolymerizable compound (B) is preferably 20 to 90% by mass based on the total amount of the component (A) and the component (B). If the above blend amount is 20 mass % or more, the base polymer can readily be entwined therein and cured. On the other hand, if it is 90% by mass or less, a film having a large thickness can readily be formed. From the viewpoints described above, a blend amount of the photopolymerizable compound (B) is more preferably 30 to 80% by mass.

A blend amount of the photopolymerization initiator (C) is preferably 0.1 to 10 parts by mass based on the total amount 100 parts by mass of the component (A) and the component (B). If the above blend amount is 0.1 parts by mass or more, the optical sensitivity is sufficiently high. On the other hand, if it is 10% by mass or less, absorption on a surface layer of the light-sensitive resin composition is prevented from growing larger in exposure, and optical curing in the inside goes on sufficiently. Further, the propagation loss is prevented from growing larger by influence of light absorption of the photopolymerization initiator itself, and it is suitable. From the viewpoints described above, a blend amount of the photopolymerization initiator (C) is more preferably 0.2 to 5% by mass.

The optical waveguide film in the present invention can readily be produced by dissolving a resin composition containing the components (A) to (C) in a solvent, coating the solution on the base material and removing the solvent. The solvent used above shall not specifically be restricted as long as it can dissolve the above resin composition, and capable of being used are, for example, solvents such as acetone, methyl ethyl ketone, methyl cellosolve, ethyl cellosolve, toluene, N,N-dimethylformamide, N,N-dimethylacetamide, propylene glycol monomethyl ether and the like and mixed solvents thereof. Usually, a concentration of solid matters contained in the resin solution is preferably 30 to 60% by mass.

A thickness of the optical waveguide film in the present invention shall not specifically be restricted, and it is usually 10 to 250 µm in terms of a thickness after dried. If it is 10 µm or more, the advantage that the coupling tolerance with a light-sensitive and light emitting element or an optical fiber can be expanded is obtained. If it is 250 µm or less, the advantage that the coupling efficiency with a light-sensitive and light emitting element or an optical fiber is enhanced is obtained. From the viewpoints described above, a thickness of the above film falls in a range of more preferably 40 to 90 μm.

The base material used in a production process of the resin film for forming an optical waveguide in the present invention is a support for supporting the film for forming an optical waveguide, and a material thereof shall not specifically be restricted. From the viewpoints of peeling off readily the film for forming an optical waveguide later and having a heat resistance and a solvent resistance, it suitably includes polyesters such as polyethylene terephthalate and the like, polypropylene, polyethylene and the like. A thickness of the above base material falls in a range of preferably 5 to 50 μm. If it is 5 μm or more, the advantage that a strength of the support is liable to be obtained is provided, and if it is 50 μm or less, the advantage that a gap with the mask in forming the patterns is decreased to make it possible to form finer patterns is obtained. From the viewpoints described above, a thickness of the above base material falls in a range of more preferably 10 to 40 μm, particularly preferably 20 to 30 μm.

The film for forming an optical waveguide provided on the base material thus obtained can readily be stored by winding in, for example, a roll form. Further, a protective film can be provided as well, if necessary, on the film for forming an optical waveguide. The base material and the protective film described above may be subjected to antistatic treatment and the like in order to make it easy to peel off the film for forming an optical waveguide later.

A production process for forming an optical waveguide by using the resin film for forming an optical waveguide obtained in the manner described above shall be explained below. The process thereof includes, for example, a process in which a lower cladding film peeled off from a base material is laminated on a substrate after removing the protective layer when the protective layer is present by pressing onto the substrate while heating. In this connection, the lamination is carried out preferably under reduced pressure from the viewpoint of the adhesive property and the following property. A heating temperature of the above resin film is preferably 50 to 130° C., and a pressing pressure thereof is preferably 0.1 to 1.0 MPa (1 to 10 kgf/cm$^2$), but the above conditions shall not specifically be restricted.

A thickness of the lower cladding layer shall not specifically be restricted, and it is preferably 2 to 50 μm. If it is 2 μm or more, it is easy to shut a propagated light in an inside of the core, and if it is 50 μm or less, a whole thickness of the optical waveguide is prevented from being too large. In the present invention, from the viewpoint of satisfying particularly a bending durability at a small bending radius, a thickness of the lower cladding layer falls in a range of more preferably 2 to 20 μm, particularly preferably 5 to 15 μm.

A thickness of the lower cladding layer is a value obtained by measuring from a boundary between the core part and the lower cladding layer to a lower surface of the lower cladding layer.

Next, the lower cladding film is cured by light or heating, and a core film having a higher refractive index than that of the lower cladding film is laminated thereon by the same method. The resin film thus laminated is imagewise irradiated with an actinic ray through a negative or positive mask pattern called an artwork. A light source for an actinic ray includes, for example, publicly known light sources radiating effectively a UV ray, such as a carbon arc lamp, a mercury vapor arc lamp, an ultrahigh pressure mercury lamp, a high pressure mercury lamp, a xenon lamp and the like. In addition to the above lamps, lamps effectively radiating a visible light, such as a photographic flood valve, a sun lamp and the like can be used as well.

A height of the core part 31 shall not specifically be restricted, and it is preferably 10 to 150 μm. If a height of the core part is 10 μm or more, the positioning tolerance is prevented from being decreased in coupling with a light-sensitive and light emitting element or an optical fiber after forming the optical waveguide, and if it is 150 μm or less, the coupling efficiency is prevented from being reduced in coupling with a light-sensitive and light emitting element or an optical fiber after forming the optical waveguide. In the present invention, from the viewpoint of satisfying particularly a bending durability at a small bending radius, a height of the core part falls in a range of more preferably 30 to 120 μm, particularly preferably 50 to 90 μm.

Next, the unexposed part is developed by removing it by wet development, dry development and the like after exposure to produce a core pattern. In this case, it is important that the core pattern is controlled so that it is not overlapped with the electric wiring in the bending part when bonded to the flexible electric wiring board later.

In respect to the development, in the case of wet development, a developer meeting a composition of the resin film described above, such as an organic solvent, an alkaline aqueous solution, a water base developer and the like is used to carry out the development, for example, by a publicly known method such as spraying, oscillation dipping, brushing, scraping and the like.

Developers which are safe and stable and have a good operability, such as organic solvents, alkaline aqueous solutions and the like are preferably used as the developer. The organic solvent base developer described above includes, for example, 1,1,1-trichloroethane, N-methylpyrrolidone, N,N-dimethylformamide, N,N-dimethylacetamide, cyclohexanone, methyl isobutyl ketone, γ-butyrolactone and the like. Water may be added to the above organic solvents in a range of 1 to 20% by mass in order to prevent ignition.

Used as a base of the alkaline aqueous solution described above are, for example, alkali hydroxides such as hydroxides of lithium, sodium and potassium; alkali carbonates such as carbonates or bicarbonates of lithium, sodium, potassium and ammonium; alkali metal phosphates such as potassium phosphate, sodium phosphate and the like; alkali metal pyrophosphates such as sodium pyrophosphate, potassium pyrophosphate and the like. Also, the alkaline aqueous solution used for the development includes preferably, for example, dilute solutions of 0.1 to 5% by mass of sodium carbonate, dilute solutions of 0.1 to 5% by mass of potassium carbonate, dilute solutions of 0.1 to 5% by mass of sodium hydroxide, dilute solutions of 0.1 to 5% by mass of sodium tetraborate and the like. A pH of the alkaline aqueous solution used for the development falls preferably in a range of 9 to 14, and a temperature thereof is controlled in accordance with a developability of the layer of the photosensitive resin composition. A surfactant, a defoaming agent, a small amount of an organic solvent for accelerating the development and the like may be mixed in the alkaline aqueous solution.

The water base developer described above includes developers comprising water or an alkaline aqueous solution and at least one organic solvent. In this regard, the alkaline substances include, in addition to the substances described above, borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2-morpholine and the like. A pH of the developer is preferably as small as possible in a range in which the resist can be developed sufficiently well, and the pH is preferably 8 to 12, more preferably 9 to 10. The organic solvent described above includes, for example, triacetone alcohol, acetone, ethyl acetate, alkoxyethanol having an alkoxy group having 1 to 4 carbon atoms, ethyl alcohol, isopropyl alcohol, butyl alcohol, diethylene glycol monomethyl ether, diethylene glycol monoethyl ether, diethylene glycol monobutyl ether and the like. They are used alone or in combination of two or more kinds thereof. Usually, a concentration of the organic solvent is preferably 2 to 90% by mass, and a temperature thereof can be controlled in accordance with a developability thereof. Small amounts of a surfactant, a defoaming agent and the like can be mixed as well in the water base developer.

Further, two or more kinds of the developing methods may be used, if necessary, in combination. The developing method includes, for example, a dipping method, a battle method, spray methods such as a high pressure spray method and the like, brushing, scraping and the like.

The core pattern may further be cured, if necessary, by heating at 60 to 250° C. or irradiating at 0.1 to 1000 mJ/cm$^2$ as treatment after the development.

Next, an upper cladding film having a lower refractive index than that of the core film is laminated thereon by the same method to prepare an optical waveguide. A thickness of the upper cladding layer shall not specifically be restricted as long as it falls in a range in which the core part can be embedded, and it is preferably 2 to 50 μm in terms of a thickness after drying. From the viewpoint of satisfying particularly the bending durability at a small bending radius, a thickness thereof falls in a range of more preferably 2 to 20 μm, particularly preferably 5 to 15 μm. A thickness of the upper cladding layer may be the same as or different from a thickness of the lower cladding layer formed at the beginning. A thickness of the upper cladding layer is a value measured from a boundary between the core part and the upper cladding layer to an upper face of the upper cladding layer.

[Flexible Electric Wiring Board]

An FPC (flexible printed circuit) board can suitably be used as the flexible electric wiring board. Polyimide, polyamide, polyetherimide, polyethylene terephthalate, liquid crystal polymers and the like are used as a board material of the FPC board, and polyimide is usually used from the viewpoint of a heat resistance and an availability. A commercially available product thereof includes, for example, an FPC board prepared by using Hapton (manufactured by Du Pont-Toray Co., Ltd.).

In this regard, a thickness of the board constituting the flexible electric wiring board shall not specifically be restricted, and a thickness of the above board is suitably decided from a thickness required to the opto-electric combined circuit board itself. To be specific, it falls in a range of preferably 5 to 50 μm.

It is important that an electric wiring in the flexible electric wiring board is wired so that in bonding to the optical waveguide, it is not overlapped with the core part in the bending part.

[Opto-electric Combined Circuit Board]

The opto-electric combined circuit board of the present invention is produced by bonding the optical waveguide film and the flexible electric wiring board each described above.

In bonding the optical waveguide film and the flexible electric wiring board, an adhesive can be used if necessary. The kind of the adhesive can suitably be decided according to the materials of the optical waveguide film and the flexible electric wiring board.

The adhesive has preferably a flexibility after cured in order to provide the opto-electric combined circuit board with a flexibility, and to be specific, it has an elastic modulus of preferably 700 MPa or less, more preferably 600 MPa or less and particularly preferably 500 MPa or less after cured. The elastic modulus is preferably 1 MPa or more, more preferably 5 MPa or more in terms of a strength of the adhesive.

In respect to the kind of the adhesive, suitably shown as the examples thereof are acryl rubber base adhesives and as commercially available products, a high heat resistant adhesive insulating material KS7003 (elastic modulus: 700 MPa) manufactured by Hitachi Chemical Co., Ltd., an adhesive Hi-Bon 808 for a flexible printed wiring board (elastic modulus: 50 MPa) manufactured by Hitachi Kasei Polymer Co., Ltd. and the like.

A bonding method of the optical waveguide film and the flexible electric wiring board shall not specifically be restricted, and it is preferably a method carried out by using a roll laminator or a flat plate laminator from the viewpoints of the adhesive property and prevention of introducing air bubbles. A lamination temperature of the roll laminator falls preferably in a range of room temperature (25° C.) to 100° C. If it is room temperature (25° C.) or higher, the adhesive property to the optical waveguide is enhanced. On the other hand, if it is 100° C. or lower, the adhesive layer is prevented from flowing, and the required thickness is obtained. From the viewpoints described above, it falls more preferably in a range of 40 to 100° C. The pressure is preferably 0.2 to 1.0 MPa (1 to 10 kgf/cm$^2$), and the lamination speed is preferably 0.1 to 3 m/minute. However, the above conditions shall not specifically be restricted.

The flat plate laminator shows a laminator in which lamination materials are interposed between a pair of flat plates and pressed by applying pressure to the flat plates, and a vacuum pressure laminator can suitably be used. In this case, the heating temperature is preferably 50 to 100° C., and the pressing pressure is preferably 0.1 to 1.0 MPa (1 to 10 kgf/cm$^2$). However, the above conditions shall not specifically be restricted.

EXAMPLES

The examples of the present invention shall more specifically be explained below, but the present invention shall by no means be restricted by these examples.

Evaluation Methods:

1. Tensile Modulus and Tensile Strength

A sample having a width of 10 mm and a length of 70 mm was obtained from the film which was targeted to be measured, and measurement was carried out according to JIS-K7127 on the following conditions by means of a tensile test equipment (RTM-100, manufactured by Orientec Co., Ltd.). Conditions: distance between chucks: 50 mm, temperature: 25° C., tensile speed: 50 mm/minute.

The tensile modulus was calculated from an equation shown below by using an initial straight line part of a tensile stress-distortion curve. Further, in the tensile stress-distortion curve, a maximum strength observed until breaking was set to the tensile strength.

Tensile modulus (MPa)=(difference (N) in stress between two points on the straight line)÷(original average cross-sectional area (mm$^2$) of optical waveguide)÷(difference in distortion between the same two points).

2. Bending Durability Test

A bending durability test was carried out for the opto-electric combined circuit boards produced in the respective examples and comparative examples by means of a bending durability test equipment of a type in which the opto-electric combined circuit board was slid as shown in FIG. 3. The test was carried out for a case in which the opto-electric combined circuit boards produced in the respective examples and comparative examples were arranged so that the optical waveguide films were faced to an inside against a bending axis 7. The test was carried out at two kinds of bending radii of 1.5 mm and 1.0 mm on the conditions of a slide speed of 80 mm/second and a distance of 20 mm between $X^1$ and $X^2$. In the evaluations, the presence of breaking was observed every 10,000 times in the cases of Example 1, Comparative Example 1 and Reference Example 1 and every 1,000 times in the cases of Comparative Example 2 to determine the maximum numbers of times in which breaking was not caused.

Example 1

(1-1) Preparation of an Optical Waveguide
Preparation of a Resin Film for Forming a Cladding Layer:

Weighed into a wide mouth plastic bottle were 48 parts by mass of a phenoxy resin (trade name: Phenotohto YP-70, manufactured by Tohto Kasei Co., Ltd.) as the binder polymer (A), 49.6 parts by mass of alicyclic diepoxycarboxylate (trade name: KRM-2110, molecular weight: 252, manufactured by Asahi Denka Co., Ltd.) as the photopolymerizable compound (B), 2 parts by mass of a triphenylsulfonium hexafluoroantimonate salt (trade name: SP-170, manufactured by Asahi Denka Co., Ltd.) as the photopolymerization initiator (C), 0.4 part by mass of SP-100 (trade name, manufactured by Asahi Denka Co., Ltd.) as a sensitizer and 40 parts by mass of propylene glycol monomethyl ether acetate as an organic solvent, and the mixture was stirred for 6 hours on the conditions of a temperature of 25° C. and a revolution of 400 rpm by means of a mechanical stirrer, a shaft and a propeller to prepare a resin vanish A for forming a cladding layer. Then, the resin vanish was filtrated under pressure through a polyflon filter (trade name: PF020, manufactured by Advantec MFS, Inc.) having a pore diameter of 2 μm on the conditions of a temperature of 25° C. and a pressure of 0.4 MPa, and it was further defoamed under reduced pressure for 15 minutes on the condition of a vacuum degree of 50 mm Hg by means of a vacuum pump and a bell jar.

The resin vanish A for forming a cladding layer obtained above was coated on a corona-treated surface of a polyamide film (trade name: Mictron, thickness; 12 μm, manufactured by Toray Industries, Inc.) by means of a coating machine (Multicoater TM-MC, manufactured by Hirano Tecseed Co., Ltd.), and it was dried at 80° C. for 10 minutes and then at 100*C for 10 minutes. Thereafter, a release PET film (trade name: Purex A31, thickness: 25 μm, manufactured by Teijin DuPont Films Japan Ltd.) as a protective film was stuck thereon so that a release surface was faced to the resin side to obtain a resin film for forming a cladding layer. In this case, a thickness of the resin layer could optionally be controlled by controlling a gap of the coating machine, and in the present example, the gap was controlled so that the film thicknesses after cured were set to 20 μm for the lower cladding layer and 70 μm for the upper cladding layer.

Preparation of a Resin Film for Forming a Core Layer:

A resin vanish B for forming a core layer was prepared by the same method on the same conditions as in the production example of the resin film for forming a cladding layer described above, except that used were 26 parts by mass of the phenoxy resin (trade name: Phenotohto YP-70, manufactured by Tohto Kasei Co., Ltd.) as the binder polymer (A), 36 parts by mass of 9,9-bis[4-(2-acryloyloxyethoxy)phenyl]fluorene (trade name: A-BPEF, manufactured by Shin-Nakamura Chemical Co., Ltd.) and 36 parts by mass of bisphenol A type epoxy acrylate (trade name: EA-1020, manufactured by Shin-Nakamura Chemical Co., Ltd.) as the photopolymerizable compound (B), 1 part by mass of bis(2,4,6-trimethylbenzoyl) phenylphosphine oxide (trade name: Irgacure 819, manufactured by Ciba Specialty Chemicals K.K) and 1 part by mass of 1-[4-(2-hydroxyethoxy)phenyl]-2-hydroxy-2-methyl-1-propane-1-one (trade name: Irgacure 2959, manufactured by Ciba Specialty Chemicals K.K) as the photopolymerization initiator (C) and 40 parts by mass of propylene glycol monomethyl ether acetate as the organic solvent. Then, the resin vanish was filtrated under pressure and further defoamed under reduced pressure by the same method on the same conditions as in the production example described above.

The resin vanish B for forming a core layer obtained above was coated on a non-treated surface of a PET film (trade name: COSMO SHINE A1517, thickness: 16 μm, manufactured by Toyobo Co., Ltd.) and dried by the same method as in the production example described above. Then, the release PET film (trade name: Purex A31, thickness: 25 μm, manufactured by Teijin DuPont Films Japan Ltd.) as a protective film was stuck thereon so that a release surface was faced to the resin side to obtain a resin film for forming a core layer. In the present example, a gap of the coating machine was controlled so that the film thickness after cured was set to 50 μm.
Preparation of an Optical Waveguide:

The release PET film (Purex A31) which was the protective film of the resin film for forming a lower cladding layer obtained above was peeled off, and the resin film was irradiated with a UV ray (wavelength: 365 nm) at 1 J/cm$^2$ from a resin side (a side reverse to the base material film) by means of a UV ray exposing machine (EXM-1172, manufactured by Orc Manufacturing Co., Ltd.), and then it was subjected to heat treatment at 80° C. for 10 minutes, whereby a lower cladding layer was formed.

Next, the resin film for forming a core layer described above was laminated on the above lower cladding layer on the conditions of a pressure of 0.4 MPa, a temperature of 50° C. and a laminating speed of 0.2 m/minute by means of a roll laminator (HLM-1500, manufactured by Hitachi Plant Techno Co., Ltd.), and then they were vacuumed to 500 Pa or lower by means of a vacuum press laminator (MVLP-500, manufactured by Meiki Co., Ltd.) as a flat plate type laminator. Thereafter, it was heated and compressed on the conditions of a pressure of 0.4 MPa, a temperature of 50° C. and a pressing time of 30 seconds to form a core layer.

Next, the resin film was irradiated with a UV ray (wavelength: 365 nm) at 0.6 J/cm$^2$ by means of the UV ray exposing machine described above using a negative type photomask having a width of 50 μm so that the core part was shaped as shown in FIG. 7, and then it was heated at 80° C. for 5 minutes after exposed.

Thereafter, the PET film which was the supporting film was peeled off, and a core pattern was developed in a developer (propylene glycol monomethyl ether acetate/N,N-dimethylacetamide=8/2, mass ratio). Subsequently, the resin film was washed with a washing liquid (isopropanol) and dried by heating at 100° C. for 10 minutes.

Then, the resin film for forming a cladding layer described above was laminated thereon as an upper cladding layer on the same laminating conditions as described above. Further, both faces thereof were irradiated with a UV ray (wavelength: 365 nm) at 25 J/cm$^2$ in total, and then the resin film was subjected to heat treatment at 160° C. for one hour, whereby an upper cladding layer was formed to prepare a flexible optical waveguide in which the base material film was disposed at an outside thereof. Further, the above flexible optical waveguide was treated for 24 hours on a high temperature and high humidity condition of 85° C./85% for peeling off the polyimide film to prepare an optical waveguide from which the base material film was removed.

The refractive indices of the core layer and the cladding layer were measured by means of a prism coupler (Model 2010) manufactured by Metricon Inc. to find that a refractive index of the core layer was 1.584 at a wavelength of 830 nm and that a refractive index of the cladding layer was 1.550. Further, a propagation loss of the optical waveguide prepared was measured by a cutback method (measured waveguide lengths: 10, 5, 3 and 2 cm, incident fiber: GI-50/125 multimode fiber (NA=0.20), output fiber: SI-114/125 (NA=0.22)) using a plane emission laser of 850 nm (FLS-300-01-VCL, manufactured by EXFO Inc.) for a light source and Q82214 manufactured by Advantest Corporation for a receiving sensor to find that it was 0.05 dB/cm.

Further, a tensile modulus and a tensile strength of the optical waveguide film obtained were measured by the methods described above to result in finding that the tensile modulus was 2,000 MPa and that the tensile strength was 70 MPa.

(1-2) Preparation of a Sheet-like Adhesive

Added and mixed by stirring were 100 parts by mass of HTR-860P-3 (trade name, glycidyl group-containing acryl rubber, molecular weight: 1,000,000, Tg: −7° C., manufactured by Teikoku Chemical Industry Co., Ltd.), 5.4 parts by mass of YDCN-703 (trade name, o-cresol novolak type epoxy resin, epoxy equivalent: 210, manufactured by Tohto Kasei Co., Ltd.), 16.2 parts by mass of YDCN-8170C (trade name, bisphenol F type epoxy resin, epoxy equivalent: 157, manufactured by Tohto Kasei Co., Ltd.), 15.3 parts by mass of Plyophen LF2882 (trade name, bisphenol A novolak resin, manufactured by Dainippon Ink & Chemicals Inc.), 0.1 part by mass of NUCA-189 (trade name, γ-mercaptopropyltrimethoxysilane, manufactured by Nippon Unicar Co., Ltd.), 0.3 part by mass of NUCA-1160 (trade name, γ-ureidopropyltriethoxysilane, manufactured by Nippon Unicar Co., Ltd.), 30 parts by mass of A-DPH (trade name, dipentaerythritol hexaacrylate, manufactured by Shin-Nakamura Chemical Co., Ltd.), 1.5 part by mass of Irgacure 369 (trade name, 2-benzyl-2-dimethylamino-1-(4-morpholinophenyl)-butanone-1-one: I-369, manufactured by Ciba Specialty Chemicals K.K.) and cyclohexanone, and the mixture was deaerated under vacuum. The above adhesive vanish was coated on surface release-treated polyethylene terephthalate (Teijin Tetron film: A-31, manufactured by Teijin Limited) having a thickness of 75 µm, and the film was dried by heating at 80° C. for 30 minutes to obtain a tacky adhesive sheet. A light transmitting supporting base material (FHF-100, low density polyethylene terephthalate/vinyl acetate/low density polyethylene terephthalate three layer film, manufactured by Thermo Co., Ltd.) having a thickness of 80 µm was laminated on the above tacky adhesive sheet to thereby prepare a sheet-like adhesive comprising the protective film (surface release-treated polyethylene terephthalate), the tacky adhesive layer and the light transmitting supporting base material. A thickness of the tacky adhesive layer was set to 10 µm.

The tacky adhesive layer of the sheet-like adhesive prepared in the above manner was cured at 160° C. for 1 hour, and a transmission factor thereof was measured by means of a U-3310 UV visible spectrophotometer manufactured by Hitachi High-Technologies Corporation to find that it had a high transmission factor of 98% or more at a wavelength of 850 nm and that it had a transmission loss corresponding to 0.1 dB or less.

The refractive index was measured by means of the prism coupler (Model 2010) manufactured by Metricon Inc. to find that it was 1.505 at a wavelength of 830 nm.

Further, a tensile modulus of the sheet-like adhesive obtained was measured by the method described above to result in finding that the tensile modulus was 350 MPa.

(1-3) Production of Opto-electric Combined Circuit Board

The sheet-like adhesive from which the protective film was peeled off was laminated on the flexible optical waveguide on the conditions of a pressure of 0.4 MPa, a temperature of 50° C. and a laminating speed of 0.2 m/minute by means of the roll laminator (HLM-1500, manufactured by Hitachi Chemical Techno Plant Co., Ltd.). Subsequently, the waveguide was processed in a rectangular form (a length: 120 mm and a width: 2 mm) by means of a dicing saw (DAD-341, manufactured by DISCO Corporation). A supporting base material side thereof was irradiated with a UV ray (365 nm) at 250 mJ/cm$^2$ to reduce an adhesive strength of an interface between the tacky adhesive layer and the supporting base material, and the supporting base material was peeled off to obtain an optical waveguide provided with an adhesive layer.

Next, the optical waveguide provided with an adhesive layer was positioned to a prescribed place of a flexible electric wiring board having an electric wiring (length: 120 mm, width: 2 mm, base material: Kapton 100EN (a tensile strength measured by the method described above was 370 MPa), board thickness; 25 µm, cupper circuit thickness: 12 µm) by making use of a mask aligner mechanism equipped in a UV ray exposing equipment (MAP-1200-L, manufactured by Dainippon Screen Mfg. Co., Ltd.), and it was temporarily adhered thereon by pressing on the conditions of a pressure of 0.4 MPa, a temperature of 80° C. and a laminating speed of 0.2 m/minute by means of the above roll laminator and then heated at 160° C. for 1 hour in a clean oven to adhere the flexible optical waveguide with the electric wiring board, whereby an opto-electric combined circuit board having a projection drawing shown in FIG. 7 was obtained.

In this regard, a light transmission factor of Kapton EN which was the base material of the flexible electric wiring board was measured by means of the U-3310 spectrophotometer manufactured by Hitachi High-Technologies Corporation to find that it was 86 at a wavelength of 850 nm. This was a transmission loss corresponding to 0.7 dB, and combination thereof with that of the tacky adhesive layer described above led to that an optical loss in transmitting through the electric wiring board was as low as less than 1 dB, so that a structure in which through-holes for light transmission were not provided was assumed in the present example. The results obtained by carrying out the evaluations by the methods described above are shown in Table 1.

Comparative Example 1

An opto-electric combined circuit board was obtained in the same manner as in Example 1, except that in Example 1, both of the core part 21 and the electric wiring 31 were linear and that the core part 21 and the electric wiring 31 in the bending part were overlapped in a projection plane.

Comparative Example 2

An opto-electric combined circuit board was prepared in the same manner as in Comparative Example 1, except that in Comparative Example 1, the sheet-like adhesive was laminated only on an end part of the flexible optical waveguide on the same conditions as in Example 1 and that a central part thereof was not bonded. The results obtained by carrying out the evaluations in the same manner as in Example 1 are shown in Table 1.

Reference Example 1

The optical waveguide simple body prepared in Example 1 was used to carry out a bending durability test as was the case with the opto-electric combined circuit board prepared in Example 1. The results thereof are shown in Table 1.

TABLE 1

|  | Bending radius (R) (mm) | bending durability test (frequency) |
|---|---|---|
| Example 1 | 1.5 | 350,000 |
|  | 1.0 | 100,000 |
| Comparative Example 1 | 1.5 | 10,000 |
|  | 1.0 | 1,000 |
| Comparative Example 2 | 1.5 | 20,000 |
|  | 1.0 | 5,000 |
| Reference Example 1 | 1.5 | 50,000 |
|  | 1.0 | 10,000 |

As shown in Table 1, it can be found that a bending durability of the opto-electric combined circuit board is dramatically enhanced by controlling the core part of the optical waveguide and the electric wiring in the bending part so that they are not overlapped in a projection plane.

INDUSTRIAL APPLICABILITY

The opto-electric combined circuit board of the present invention has such a very good bending durability that breaking and cracking are not generated over a long period of time even after repeating bending. Accordingly, the opto-electric combined circuit board of the present invention can suitably be used for electronic devices such as Cellular phones and the like, and even in a case where the board is required to be bent in a hinge part at such a small bending radius that R is 1.5 to 2 mm, the good communication function can be maintained over a long period of time to make it possible to achieve a high reliability and a high durability of the electronic devices themselves.

What is claimed is:

1. An opto-electric combined circuit board in which an optical waveguide film provided with a core part and a clad is bonded to a flexible electric wiring board, the opto-electric combined circuit board having a bending part, wherein the flexible electric wiring board has a plurality of electric wirings, one of the electric wirings being closest to the core part, with the core part and the electric wiring closest to the core part not overlapping, in a projection plane obtained by observing the opto-electric combined circuit board from a vertical direction with respect to a surface of the wiring board on which the plurality of electric wirings extend, in the bending part, and wherein the core part of the optical waveguide film and the electric wiring closest to the core part overlapping in said projection plane in a part other than the bending part.

2. The opto-electric combined circuit board according to claim 1, wherein the optical waveguide film is bonded to the flexible electric wiring board on a whole surface.

3. An electronic device comprising the opto-electric combined circuit board according to claim 1 and a hinge for bending the above opto-electric combined circuit board, wherein the electronic device has a structure in which a part of the opto-electric combined circuit board is movable to a rotational direction at the above hinge as a center.

4. An electronic device comprising the opto-electric combined circuit board according to claim 1 and having a structure in which at least one end part of the opto-electric combined circuit board moves to a horizontal direction while maintaining a bent state in a bending part as a center and in which the bending part moves following the above movement.

5. The opto-electric combined circuit board according to claim 1, wherein, in the bending part, said plurality of electric wirings are provided in an outer part, and the core part is provided in a central part, of said projection plane.

6. The opto-electric combined circuit board according to claim 1, wherein the core part and the electric wiring closest to the core part are overlapped in said projection plane at least in one end part thereof.

* * * * *